(12) United States Patent
Endo et al.

(10) Patent No.: US 7,771,918 B2
(45) Date of Patent: Aug. 10, 2010

(54) SEMICONDUCTOR MANUFACTURING APPARATUS AND PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 1332 days.

(21) Appl. No.: 11/143,667

(22) Filed: Jun. 3, 2005

(65) Prior Publication Data

US 2005/0277068 A1 Dec. 15, 2005

(30) Foreign Application Priority Data

Jun. 9, 2004 (JP) .............................. 2004-171589

(51) Int. Cl.
*G03F 7/00* (2006.01)
(52) U.S. Cl. .................................................. 430/322
(58) Field of Classification Search ................ 430/311, 430/322, 273.1; 355/30
See application file for complete search history.

(56) References Cited

U.S. PATENT DOCUMENTS

| | | | |
|---|---|---|---|
| 4,704,348 A | 11/1987 | Koizumi et al. | |
| 5,134,436 A | 7/1992 | Fujioka | |
| 5,610,683 A | 3/1997 | Takahashi | |
| 6,583,849 B1* | 6/2003 | Noda et al. | 355/18 |
| 7,061,578 B2* | 6/2006 | Levinson | 355/53 |
| 7,094,521 B2 | 8/2006 | Endo et al. | |
| 7,471,371 B2* | 12/2008 | Kameyama | 355/30 |
| 2002/0006737 A1* | 1/2002 | Kitano et al. | 438/775 |
| 2005/0046813 A1* | 3/2005 | Streefkerk et al. | 355/30 |
| 2005/0161644 A1* | 7/2005 | Zhang et al. | 252/582 |
| 2005/0219490 A1 | 10/2005 | Owa | |
| 2005/0259234 A1 | 11/2005 | Hirukawa et al. | |
| 2007/0024832 A1 | 2/2007 | Owa | |

FOREIGN PATENT DOCUMENTS

| | | |
|---|---|---|
| EP | 0 320 297 | 6/1989 |
| EP | 1 420 302 A1 | 5/2004 |
| JP | 06-168866 | 6/1994 |
| JP | 09-006010 | 1/1997 |
| JP | 10-303114 | 11/1998 |
| JP | 10-340846 | 12/1998 |
| JP | 11-176727 | 7/1999 |
| JP | 2001-125282 | * 5/2001 |
| JP | 2001-194798 | 7/2001 |

(Continued)

OTHER PUBLICATIONS

English Machine Translation, JP 2001-125282.*

(Continued)

*Primary Examiner*—Kathleen Duda
*Assistant Examiner*—Caleen O Sullivan
(74) *Attorney, Agent, or Firm*—McDermott Will & Emery LLP (57) ABSTRACT

In a pattern formation method employing immersion lithography, after a resist film is formed on a wafer, pattern exposure is performed by selectively irradiating the resist film with exposing light with a liquid including an unsaturated aliphatic acid, such as sunflower oil or olive oil including oleic acid, provided on the resist film. After the pattern exposure, the resist film is developed so as to form a resist pattern made of the resist film.

11 Claims, 6 Drawing Sheets

FOREIGN PATENT DOCUMENTS

| | | |
|---|---|---|
| JP | 2002-226322 | 8/2002 |
| JP | 2004-18375 | 1/2004 |
| JP | 2004-282023 | 10/2004 |
| JP | 2004-335821 | 11/2004 |
| JP | 2005-136326 | 5/2005 |
| JP | 2008-504708 | 2/2008 |
| JP | 2007-519238 | 7/2008 |
| WO | WO 99/49504 | 9/1999 |
| WO | WO 2004/053955 A1 | 6/2004 |
| WO | WO 2004/086470 A1 | 10/2004 |
| WO | WO 2005/071491 A2 | 8/2005 |
| WO | WO 2006/003373 A2 | 1/2006 |

OTHER PUBLICATIONS

European Search Report issued in European Patent Application No. EP 05 01 2156, mailed Feb. 29, 2008.

Baek, S., et al., "Simulation of the coupled thermal/optical effects for liquid immersion micro-/nanolithography", Proceedings of SPIE—Optical Microlithography XVII, Feb. 2004, pp. 415-427, vol. 5377, SPIE, Bellingham, WA USA, (XP-002467001).

Switkes et al.; "Immersion Lithography at 157 nm"; *J. Vac. Sci. Technol. B 19(6)*; c. 2001; American Vacuum Society; pp. 2353-2356.

Japanese Office Action, with English Translation, issued in Japanese Patent Application No. JP 2004-17589 dated on Jun. 10, 2008.

Chinese Office Action, with English translation, issued in Chinese Patent Application No. CN 2005100742905, mailed Apr. 25, 2008.

Japanese Office Action, with English translation, issued in Japanese Patent Application No. JP 2008-187660, mailed Jan. 20, 2009.

Japanese Office Action, with English translation, issued in Japanese Patent Application No. JP 2004-171589, mailed Jan. 20, 2009.

\* cited by examiner

SEMICONDUCTOR MANUFACTURING APPARATUS AND PATTERN FORMATION METHOD

CROSS-REFERENCE TO RELATED APPLICATIONS

This application claims priority under 35 U.S.C. §119 on Patent Application No. 2004-171589 filed in Japan on Jun. 9, 2004, the entire contents of which are hereby incorporated by reference.

BACKGROUND OF THE INVENTION

The present invention relates to a semiconductor manufacturing apparatus for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Now, a conventional pattern formation method employing the immersion lithography will be described with reference to FIGS. 6A through 6D.

Figure 6A:
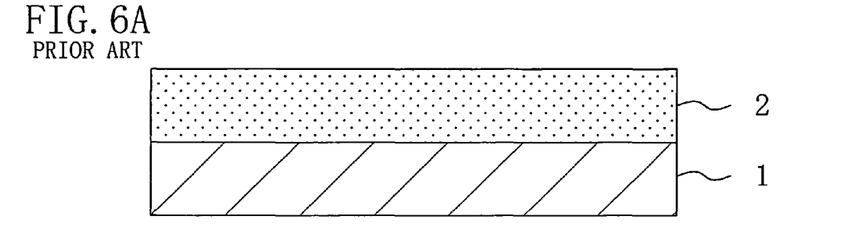
FIGS. 6A, 6B, 6C and 6D are cross-sectional views for showing procedures in a conventional pattern formation method.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium nonaflate | 0.06 g |
| Quencher: triethanolamine | 0.002 g |
| Solvent: propylene glycol monomethyl ether acetate | 20 g |

Next, as shown in FIG. 6A, the aforementioned chemically amplified resist material is applied on a substrate 1 so as to form a resist film 2 with a thickness of 0.35 μm.

Figure 6B:
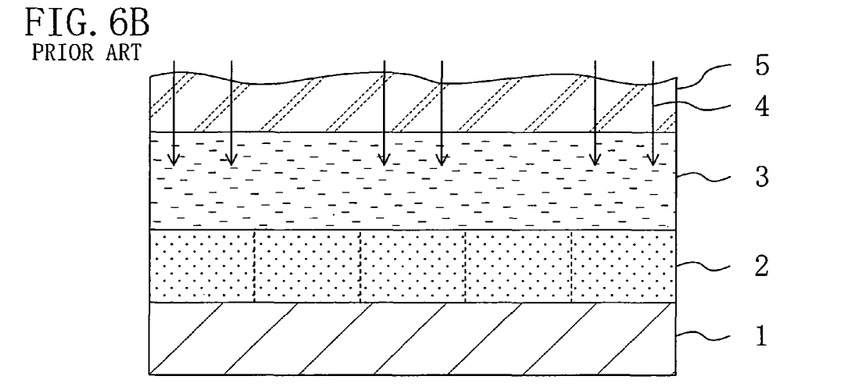

Then, as shown in FIG. 6B, with a liquid (water) 3 whose temperature is room temperature of, for example, approximately 23° C. provided between the resist film 2 and a projection lens 5, pattern exposure is carried out by irradiating the resist film 2 with exposing light 4 of ArF excimer laser with NA of 0.68 through a mask.

Figure 6C:
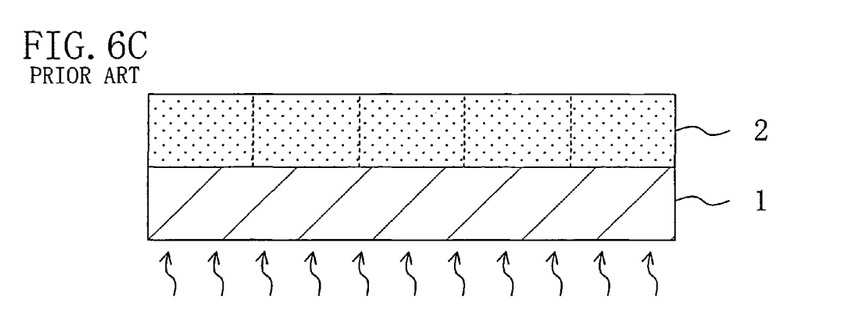

After the pattern exposure, as shown in FIG. 6C, the resist film 2 is baked with a hot plate at a temperature of 105° C. for 60 seconds, and the resultant resist film is developed with a tetramethylammonium hydroxide developer. In this manner, a resist pattern 2a made of an unexposed portion of the resist film 2 is formed as shown in FIG. 6D.

SUMMARY OF THE INVENTION

Figure 6D:
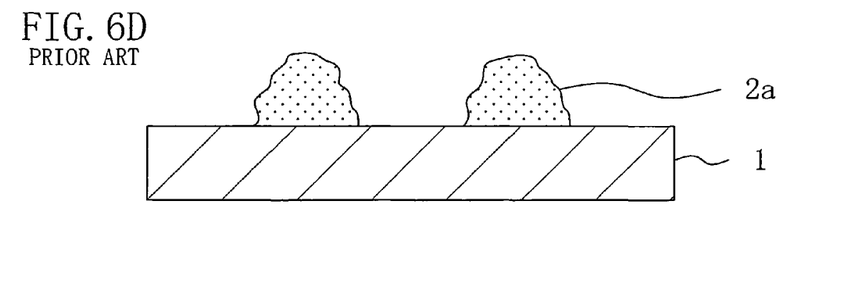

As shown in FIG. 6D, however, the resist pattern 2a formed by the conventional pattern formation method employing the immersion lithography is in a defective shape.

The present inventors have variously examined the reason why the resist pattern formed by the conventional immersion lithography is in a defective shape, resulting in finding the following: The immersion liquid 3 evaporates during the exposure, and hence, an air space is formed between the liquid 3 and the projection lens 5. This air space varies the refractive index of the liquid 3, so that given resolution cannot be attained. As a result, the resist pattern is formed in a defective shape.

Accordingly, when the exposure is performed through the immersion liquid partially evaporated, the resist pattern is formed in a defective shape, and when the resist pattern in such a defective shape is used for etching, a pattern obtained from an etched film is also in a defective shape. As a result, the productivity and yield of fabrication process for semiconductor devices are lowered.

In consideration of the aforementioned conventional problem, an object of the invention is forming a resist pattern in a good shape through the immersion lithography.

In order to achieve the object, in a pattern formation method employing the immersion lithography according to the invention, a liquid having a composition minimally evaporating is used as the immersion liquid, or the immersion liquid is provided in an atmosphere in which it minimally evaporates during exposure. Also, in a semiconductor manufacturing apparatus according to the invention, pattern exposure is carried out in an atmosphere in which the immersion liquid minimally evaporates during exposure.

Specifically, the first pattern formation method of this invention includes the steps of forming a resist film on a substrate; performing pattern exposure by selectively irradiating the resist film with exposing light with a liquid including an unsaturated aliphatic acid provided on the resist film; and forming a resist pattern by developing the resist film after the pattern exposure.

In the first pattern formation method, the immersion liquid minimally evaporates owing to the unsaturated aliphatic acid included therein. Therefore, abnormality of the refractive index or the like otherwise caused by the evaporation of the immersion liquid during exposure can be prevented, and the liquid keep a desired refractive index (exposure characteristic) during the exposure. As a result, the resist pattern can be formed in a good shape through the immersion lithography.

The present inventors have found that an unsaturated aliphatic acid has a high moisture retention function because it is highly lipidic. This moisture retention function is attained by a function derived from a double or triple bond of carbons in the unsaturated aliphatic acid or a function derived from a carboxylic acid group. The double or triple bond of carbons is, in a molecule bonded through a single bond, in a state where electrons are partially collected between carbon atoms in particular. Also, a double bond between carbon and oxygen included in a carboxylic acid group is a double bond with oxygen having higher electronegativity than carbon, and hence attracts more electrons than a double bond of carbons, and therefore, it is in a state with high ionicity. As a result, an interaction is easily caused even with a molecule or a substituent having low ionicity, and an interaction is particularly easily caused with a hydroxyl group included in the immersion liquid. Accordingly, the unsaturated aliphatic acid has a high moisture retention function and can suppress the evaporation of the immersion liquid.

The unsaturated aliphatic acid preferably has a structure in which the double or triple bond of carbons and a carbonyl group derived from carboxylic acid are comparatively close to each other. When the unsaturated aliphatic acid has such a structure in which the double or triple bond and the carbonyl group are close to each other, plenty of electrons present in the bond therebetween can be shared as shown in Chemical Formula 1 below. Therefore, the state with ionicity is made more stable, so as to increase the moisture retention function.

Chemical Formula 1:

The second pattern formation method of this invention includes the steps of forming a resist film on a substrate; performing pattern exposure by selectively irradiating the resist film with exposing light with a liquid provided on the resist film; and forming a resist pattern by developing the resist film after the pattern exposure, and a temperature of an exposure atmosphere is lower than a temperature of the liquid in the step of performing pattern exposure.

In the second pattern formation method, since the temperature of the exposure atmosphere is lower than that of the liquid in the step of performing pattern exposure, the saturated vapor pressure (the maximum vapor pressure) of the exposure atmosphere is lowered. Therefore, the immersion liquid minimally evaporates, and hence, the abnormality of the refractive index or the like otherwise caused by the evaporation of the immersion liquid during the exposure can be prevented, so as to keep a desired refractive index. As a result, the resist pattern can be formed in a good shape through the immersion lithography.

The third pattern formation method of this invention includes the steps of forming a resist film on a substrate; performing pattern exposure by selectively irradiating the resist film with exposing light with a liquid provided on the resist film and with the substrate cooled; and forming a resist pattern by developing the resist film after the pattern exposure.

In the third pattern formation method, since the pattern exposure is performed with the liquid provided on the resist film and with the substrate cooled, the liquid thus cooled minimally evaporates. Therefore, the abnormality of the refractive index or the like otherwise caused by the evaporation of the immersion liquid during the exposure can be prevented, so as to keep a desired refractive index. As a result, the resist pattern can be formed in a good shape through the immersion lithography.

In the first pattern formation method, the unsaturated aliphatic acid may be oleic acid ($CH_3$—$(CH_2)_7$—CH=CH—$(CH_2)_7$—COOH).

In this case, the oleic acid can be olive oil, safflower oil, sunflower oil or canola oil. The content of the unsaturated aliphatic acid in the liquid can be not less than 0.01 wt % and not more than 5 wt %, which does not limit the invention.

In the second pattern formation method, the temperature of the exposure atmosphere is preferably higher than 0° C. and lower than 23° C.

In the third pattern formation method, a temperature of the cooled substrate is preferably lower than a temperature of an exposure atmosphere.

In this case, the temperature of the exposure atmosphere is preferably higher than 0° C. and lower than 23° C.

In each of the first through third pattern formation methods, the liquid can be water or perfluoropolyether.

Furthermore, in each of the first through third pattern formation methods, the immersion liquid may include an additive. For example, in the case where cesium sulfate ($CsSO_4$) or ethyl alcohol ($C_2H_5OH$) is used as an additive for increasing the refractive index of the liquid, if the additive included in the liquid evaporates or volatiles, the variation in the refractive index may more harmfully affect the exposure characteristic, and therefore, the present invention is extremely effective in such a case.

The first semiconductor manufacturing apparatus of this invention includes an exposure unit for performing pattern exposure with a liquid provided between a resist film and an exposure lens; a liquid supplying section for supplying the liquid onto the resist film; a liquid discharging section for discharging the liquid provided on the resist film from the resist film; a temperature measuring unit for measuring a temperature of the liquid and an atmosphere temperature of the exposure unit; an air conditioning unit for adjusting the atmosphere temperature; and a temperature control unit for controlling the air conditioning unit on the basis of the temperature of the liquid and the atmosphere temperature measured by the temperature measuring unit in such a manner that the atmosphere temperature is lower than the temperature of the liquid.

In the first semiconductor manufacturing apparatus, since the saturated vapor pressure of the exposure atmosphere is lowered, the immersion liquid minimally evaporates. Therefore, the abnormality of the refractive index or the like otherwise caused by the evaporation of the immersion liquid during the exposure can be prevented, so as to keep a desired refractive index. As a result, the resist pattern can be formed in a good shape through the immersion lithography.

In the first semiconductor manufacturing apparatus, the exposure unit and the air conditioning unit are preferably provided within one chamber.

The second semiconductor manufacturing apparatus of this invention includes a wafer holding section; an exposure unit for performing pattern exposure with a liquid provided between a resist film formed on the wafer and an exposure lens; a liquid supplying section for supplying the liquid onto the resist film; a liquid discharging section for discharging the liquid provided on the resist film from the resist film; a temperature measuring unit for measuring a temperature of the liquid and a temperature of the wafer holding section; and a cooling section for cooling the wafer holding section.

In the second semiconductor manufacturing apparatus, since the immersion liquid is cooled through the wafer holding section cooled by the cooling section, the cooled liquid minimally evaporates. Therefore, the abnormality of the refractive index or the like otherwise caused by the evaporation of the immersion liquid during the exposure can be prevented, so as to keep a desired refractive index. As a result, the resist pattern can be formed in a good shape through the immersion lithography.

The second semiconductor manufacturing apparatus preferably further includes a temperature control unit for controlling a temperature of the cooling section on the basis of the temperature of the liquid and the temperature of the wafer holding section measured by the temperature measuring unit.

In the first or second semiconductor manufacturing apparatus, the liquid may be water or perfluoropolyether.

In each of the first through third pattern formation methods and the first and second semiconductor manufacturing apparatuses, a light source of the exposure unit can be KrF excimer laser, $Xe_2$ laser, ArF excimer laser, $F_2$ laser, KrAr laser or $Ar_2$ laser.

DETAILED DESCRIPTION OF THE INVENTION

Embodiment 1

Now, a pattern formation method according to Embodiment 1 of the invention will be described with reference to FIGS. 1A through 1D.

Figure 1A:
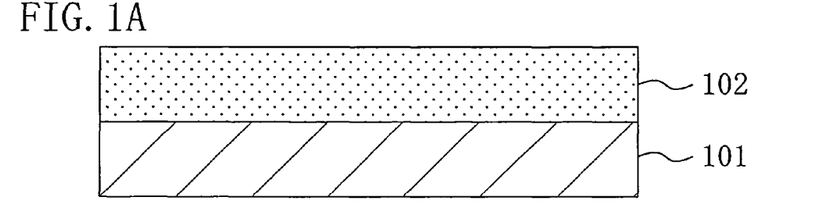
FIGS. 1A, 1B, 1C and 1D are cross-sectional views for showing procedures in a pattern formation method according to Embodiment 1 of the invention.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium nonaflate | 0.06 g |
| Quencher: triethanolamine | 0.002 g |
| Solvent: propylene glycol monomethyl ether acetate | 20 g |

Next, as shown in FIG. 1A, the aforementioned chemically amplified resist material is applied on a wafer 101 so as to form a resist film 102 with a thickness of 0.35 μm.

Figure 1B:
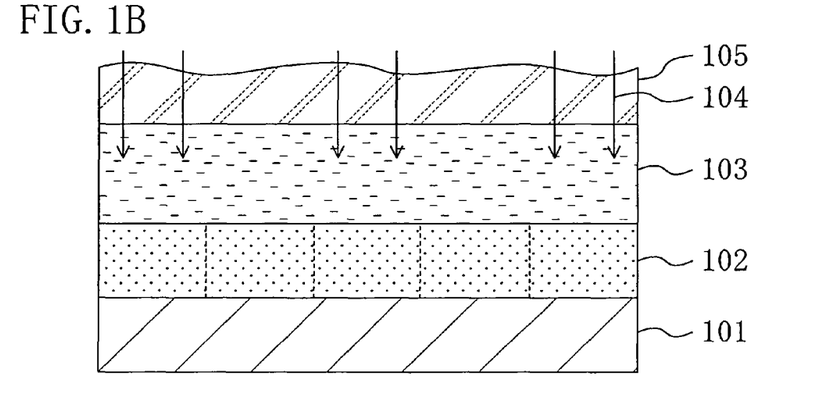

Then, as shown in FIG. 1B, a liquid 103 that contains 1 wt % of sunflower oil including oleic acid, that is, an unsaturated aliphatic acid, is provided between the resist film 102 and a projection lens 105. Under this condition, pattern exposure is carried out by irradiating the resist film 102 through a mask (not shown) with exposing light 104 of ArF excimer laser with NA of 0.68. At this point, the temperature of the liquid 103 is set to room temperature of, for example, approximately 23° C.

Figure 1C:
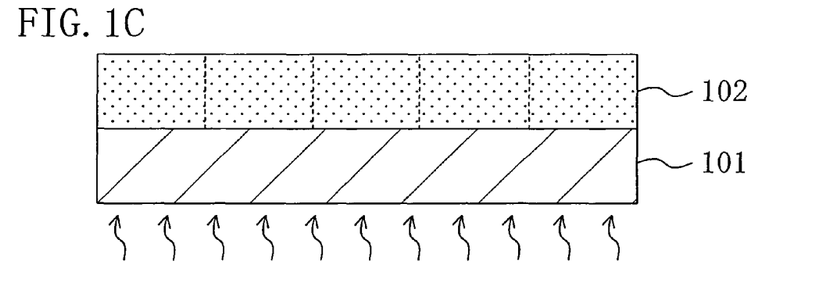
Figure 1D:
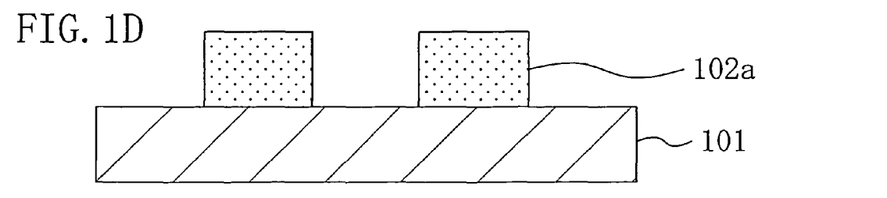

After the pattern exposure, as shown in FIG. 1C, the resist film 102 is baked with a hot plate at a temperature of 105° C. for 60 seconds, and thereafter, the resultant resist film 102 is developed with a 2.38 wt % tetramethylammonium hydroxide developer. In this manner, a resist pattern 102a made of an unexposed portion of the resist film 102 and having a line width of 0.09 μm is formed in a good shape as shown in FIG. 1D.

In this manner, in the pattern formation method of Embodiment 1, the sunflower oil including oleic acid, that is, an unsaturated aliphatic acid, is contained in the immersion liquid 103, and therefore, the liquid 103 minimally evaporates owing to the moisture retention function of the unsaturated aliphatic acid. Therefore, no air space is formed in the liquid 103 provided between the resist film 102 and the projection lens 105. Accordingly, abnormality of the refractive index or the like of the liquid 103 otherwise caused by an air space can be avoided, and hence, the liquid 103 can keep a desired exposure characteristic. As a result, the resist pattern can be formed in a good shape through the immersion lithography.

As the oleic acid corresponding to the unsaturated aliphatic acid, olive oil, safflower oil, canola oil or the like can be used instead of the sunflower oil. The content of the unsaturated aliphatic acid in the liquid 103 may be not less than 0.01 wt % and not more than 5 wt %, which does not limit the invention.

Embodiment 2

A semiconductor manufacturing apparatus and a pattern formation method using the same according to Embodiment 2 of the invention will now be described with reference to the accompanying drawings.

Figure 2:
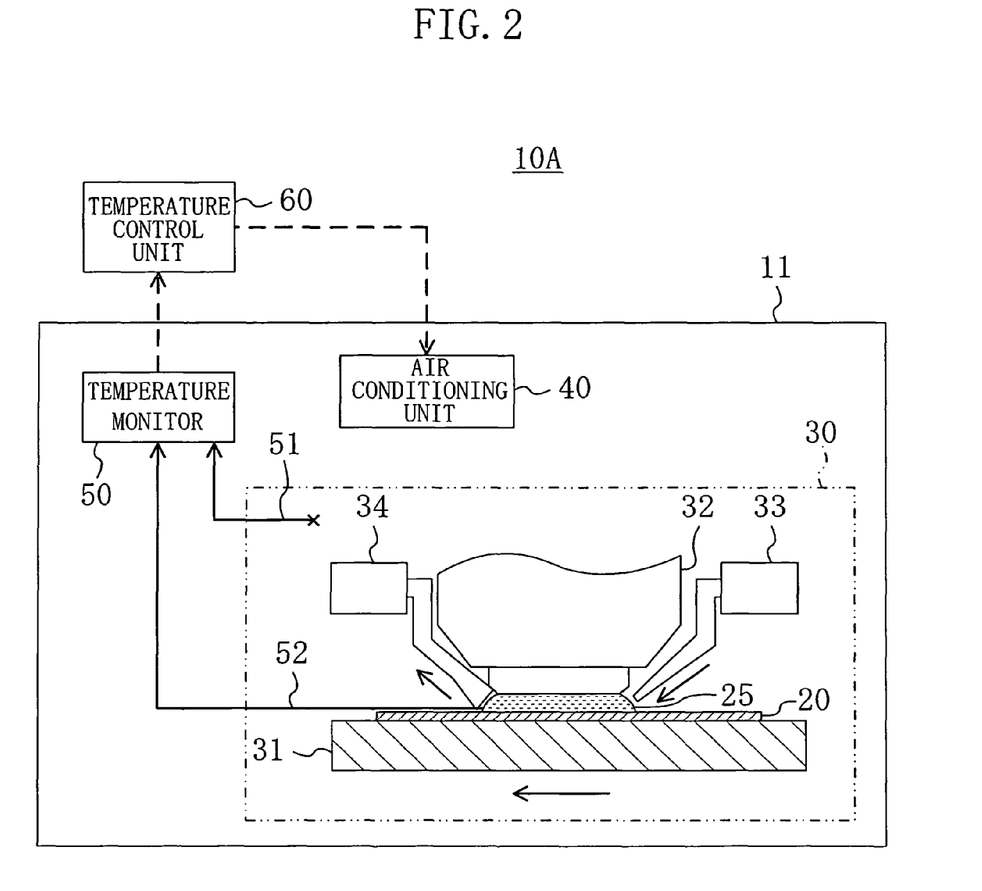
FIG. 2 is a schematic cross-sectional view of a principal part of a semiconductor manufacturing apparatus according to Embodiment 2 of the invention.

FIG. 2 schematically shows the cross-sectional structure of a principal part of the semiconductor manufacturing apparatus according to Embodiment 2 of the invention. As shown in FIG. 2, the semiconductor manufacturing apparatus 10A of Embodiment 2 includes, within a chamber 11, an exposure unit 30 for exposing a desired design pattern on a resist film, an air conditioning unit 40 for adjusting the temperature within the chamber 11, and a temperature monitor 50 for measuring the temperature of the exposure unit 30 such as the temperature of an immersion liquid and the temperature of the exposure atmosphere.

A temperature control unit 60 for controlling the air conditioning unit 40 on the basis of the temperature of the exposure unit 30, namely, the atmosphere temperature within the chamber 11 and the temperature of the immersion liquid 25, sent from the temperature monitor 50 is provided outside the chamber 11.

The exposure unit 30 includes a movable stage 31 for holding a wafer 20 having a resist film (not shown) on a top surface thereof, a projection lens (exposure lens) 32 disposed above the wafer 20 held on the movable stage 31, a liquid supplying section 33 for supplying the immersion liquid 25 to a region between the resist film and the projection lens 32, and a liquid discharging section 34 for discharging the liquid 25 from above the resist film after the exposure. It is noted that an illumination optical system including a light source for exposing light and a mask (reticle) having a desired design pattern generally provided above the projection lens 32 are omitted in FIG. 2.

The temperature monitor 50 measures a temperature at a first measurement point 51 for obtaining the temperature of the exposure atmosphere in the exposure unit 30 and a temperature at a second measurement point 52 for obtaining the temperature of the liquid 25 provided between the wafer 20 and the projection lens 32, and sends temperature data thus obtained to the temperature control unit 60.

The temperature control unit 60 controls the operation of the air conditioning unit 40 on the basis of the received temperature data, so that when the temperature of the exposure atmosphere obtained at the first measurement point 51 (i.e., the temperature within the chamber 11) is higher than the temperature of the immersion liquid 25 obtained at the second measurement point 52, the temperature within the chamber 11 can become lower than the temperature of the liquid 25.

In this manner, in the semiconductor manufacturing apparatus 10A of Embodiment 2, the temperature of the exposure atmosphere within the chamber 11 can be controlled to be lower than the immersion liquid 25 during the exposure. It is noted that the atmosphere temperature is preferably higher than 0° C. and not higher than 23° C.

Accordingly, when the temperature of the exposure atmosphere is lower than the temperature of the liquid 25, the saturated vapor pressure of the liquid 25 is lowered and the liquid 25 can be indirectly cooled. Therefore, evaporation of the liquid 25 can be suppressed during the exposure, and hence, no air space is formed in the liquid 25 provided between the wafer 20 and the projection lens 32. As a result, the abnormality of the refractive index or the like otherwise caused in the liquid 25 can be avoided, so that the immersion liquid 25 can keep a desired exposure characteristic.

Furthermore, since the temperature within the chamber 11 is adjusted through the temperature control unit 60 by both the air conditioning unit 40 and the temperature monitor 50, the temperature of the immersion liquid 25 can be prevented from largely varying during the exposure. As a result, the variation of the refractive index of the liquid 25 caused by the temperature change can be also suppressed, and hence, variation in the exposure accuracy caused among a plurality of shots can be reduced. In general, the principal surface of the wafer 20 is divided into a plurality of exposure regions, and the respective divided exposure regions are successively irradiated with exposing light. The irradiation with the exposing light thus performed on each exposure region is designated as one shot.

Although the second measurement point 52 is set for measuring the temperature of the immersion liquid 25 provided between the resist film and the projection lens 32 in Embodiment 2, the temperature in the vicinity of the liquid 25, namely, the ambient temperature of the liquid 25, may be measured at the second measurement point 52.

Also, the evaporation of the liquid 25 can be further suppressed by adding an unsaturated aliphatic acid of oleic acid or the like to the liquid 25 in the same manner as in Embodiment 1.

(Pattern Formation Method)

Now, a pattern formation method using the semiconductor manufacturing apparatus having the aforementioned structure will be described with reference to FIGS. 3A through 3D.

Figure 3A:
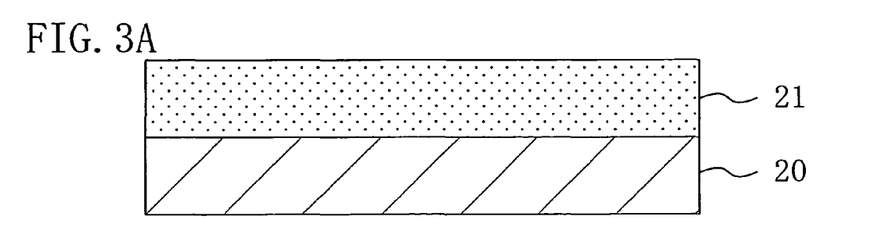
FIGS. 3A, 3B, 3C and 3D are cross-sectional views for showing procedures in a pattern formation method according to Embodiment 2 of the invention.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium nonaflate | 0.06 g |
| Quencher: triethanolamine | 0.002 g |
| Solvent: propylene glycol monomethyl ether acetate | 20 g |

Next, as shown in FIG. 3A, the aforementioned chemically amplified resist material is applied on a wafer 20 so as to form a resist film 21 with a thickness of 0.35 μm.

Figure 3B:
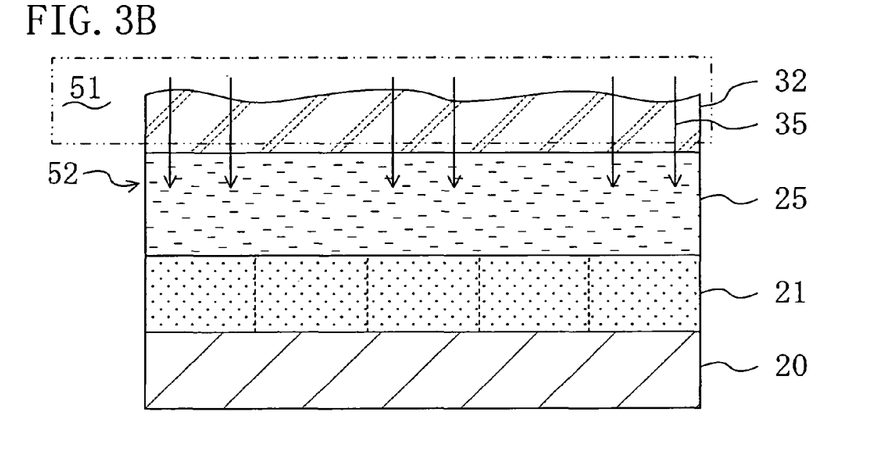

Then, the wafer 20 having the resist film 21 thereon is held on the movable stage 31 of the exposure unit 30 of the semiconductor manufacturing apparatus 10A shown in FIG. 2, and subsequently, as shown in FIG. 3B, a liquid 25 whose temperature is set to room temperature of approximately 23° C. is provided between the resist film 21 and the projection lens 32. At this point, the temperature control unit 60 of FIG. 2 controls the air conditioning unit 40 on the basis of the temperature data of the liquid 25 obtained at the second measurement point 52, so that the temperature of the exposure atmosphere, namely, the temperature data obtained at the first measurement point 51, can be 15° C. Under this condition, pattern exposure is carried out by irradiating the resist film 21 through a mask (not shown) with exposing light 35 of ArF excimer laser with NA of 0.68.

Figure 3C:
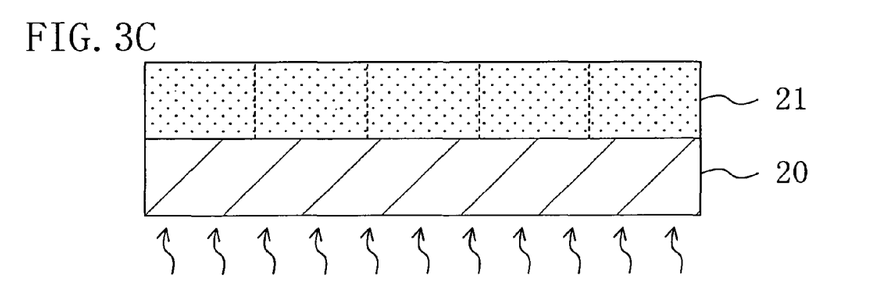
Figure 3D:
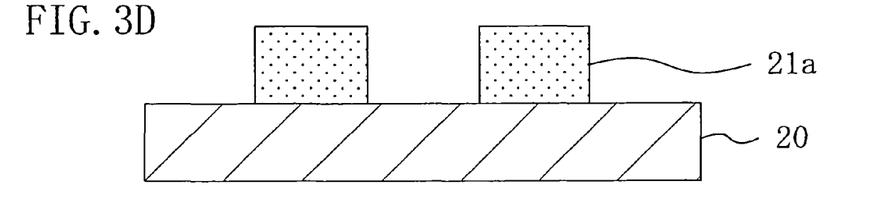

After the pattern exposure, as shown in FIG. 3C, the resist film 21 is baked with a hot plate at a temperature of 105° C. for 60 seconds, and thereafter, the resultant resist film 21 is developed with a 2.38 wt % tetramethylammonium hydroxide developer. In this manner, a resist pattern 21a made of an unexposed portion of the resist film 21 and having a line width of 0.09 μm is formed in a good shape as shown in FIG. 4D.

In this manner, in the pattern formation method of Embodiment 2, the temperature within the chamber 11, namely, the temperature of the exposure atmosphere, is set to be lower than the temperature of the liquid 25 during the exposure. Therefore, the liquid 25 minimally evaporates, and hence, no air space is formed in the liquid 25 provided between the resist film 21 and the projection lens 32. Accordingly, the abnormality of the refractive index or the like otherwise caused in the liquid 25 by an air space can be avoided, so that the liquid 25 can keep a desired exposure characteristic. As a result, the resist pattern 21a can be formed in a good shape through the immersion lithography.

Embodiment 3

A semiconductor manufacturing apparatus and a pattern formation method using the same according to Embodiment 3 of the invention will now be described with reference to the accompanying drawings.

Figure 4:
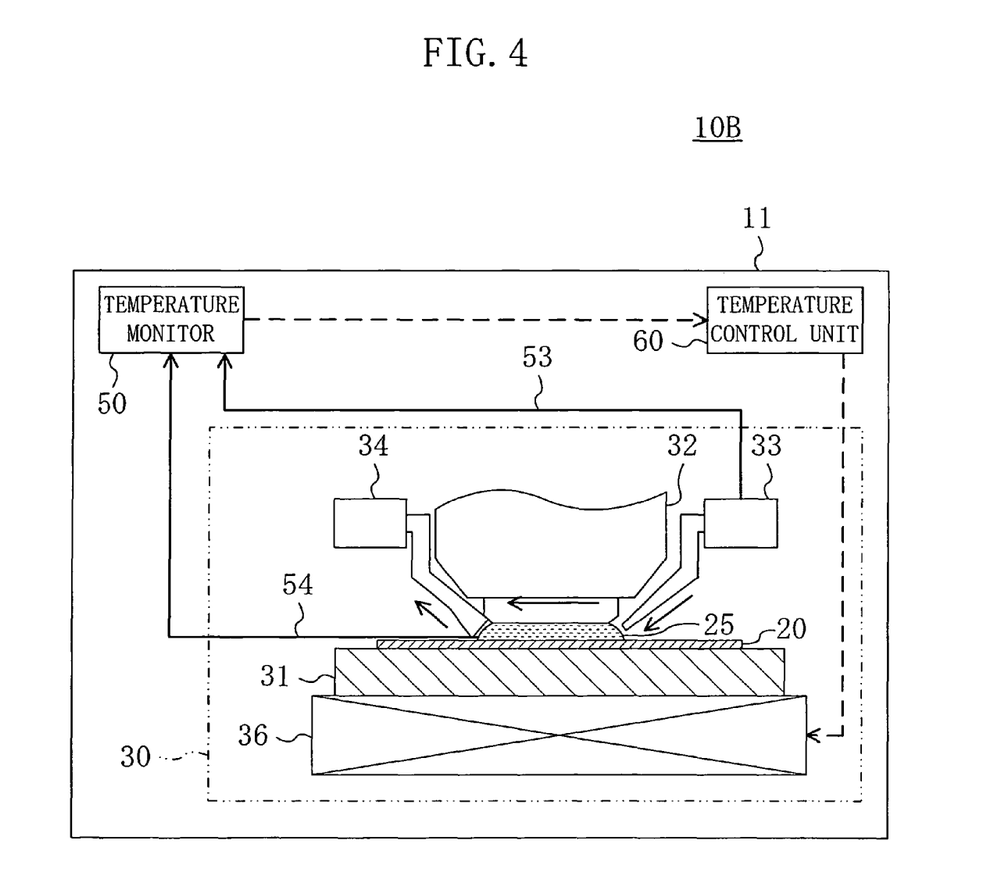
FIG. 4 is a schematic cross-sectional view of a principal part of a semiconductor manufacturing apparatus according to Embodiment 3 of the invention.

FIG. 4 schematically shows the cross-sectional structure of a principal part of the semiconductor manufacturing apparatus according to Embodiment 3 of the invention. In FIG. 4, like reference numerals are used to refer to like elements shown in FIG. 2 so as to omit the description. As shown in FIG. 4, the semiconductor manufacturing apparatus 10B of Embodiment 3 includes, below a movable stage 31 of an exposure unit 30 within a chamber 11, a cooling section 36 capable of cooling the movable stage 31.

A temperature monitor 50 measures a temperature of a liquid 25 present in a liquid supplying section 33 of the exposure unit 30 at a first measurement point 53 and a temperature of the liquid 25 provided between a wafer 20 and a projection lens 32 at a second measurement point 54, and sends temperature data thus obtained to a temperature control unit 60.

The temperature control unit 60 of Embodiment 3 is provided within the chamber 11 and controls the temperature of the cooling section 36 on the basis of the temperature of the liquid 25 present in the liquid supplying section 33 and the temperature of the liquid 25 provided on the wafer 20 that are sent from the temperature monitor 50. The temperature control unit 60 may be provided inside or outside the chamber 11.

The temperature control unit 60 cools the cooling section 36 on the basis of the received temperature data, so that when the temperature of the immersion liquid 25 obtained at the second measurement point 54 is higher than the temperature of the liquid 25 before the supply obtained at the first measurement point 53, the temperature of the liquid 25 provided on the wafer 20 can become equivalent to or lower than the temperature of the liquid 25 before the supply. Accordingly, the liquid 25 provided on the wafer 20 is indirectly cooled through the movable stage 31 by the cooling section 36 thus cooled.

In a specific example of the structure of the cooling section 36, at least one refrigerant pipe capable of allowing a refrigerant to flow therein is disposed below the movable stage 31. When the refrigerant is thus circulated below the movable stage 31, the liquid 25 can be indirectly cooled through the movable stage 31, the wafer 20 and the resist film.

In this manner, in the semiconductor manufacturing apparatus 10B of Embodiment 3, it is possible to suppress, during the exposure, the temperature increase of the immersion liquid 25 provided on the wafer 20 caused by light energy of the exposing light and kinetic energy generated in moving from the liquid supplying section 33 to a liquid discharging section 34.

Accordingly, since the temperature of the immersion liquid 25 provided on the wafer 20 can be appropriately controlled, the evaporation of the liquid 25 provided on the wafer 20 during the exposure can be suppressed. Also, since the temperature of the liquid 25 is adjusted through the temperature control unit 60 by both the temperature monitor 50 and the cooling section 36, the temperature of the liquid 25 can be prevented from largely varying during the exposure. As a result, the variation of the refractive index of the liquid 25 caused by the temperature change can be also suppressed, and therefore, the variation in the exposure accuracy among a plurality of shots can be reduced.

Although the second measurement point 54 is set for measuring the temperature of the immersion liquid 25 provided between the resist film and the projection lens 32 in Embodiment 3, the temperature in the vicinity of the liquid 25, namely, the ambient temperature of the liquid 25, may be measured at the second measurement point 54.

Also, the evaporation of the liquid 25 can be further suppressed by adding an unsaturated aliphatic acid of oleic acid or the like to the liquid 25 in the same manner as in Embodiment 1.

Furthermore, the semiconductor manufacturing apparatus 10B of Embodiment 3 does not always need the chamber 11.

(Pattern Formation Method)

Now, a pattern formation method using the semiconductor manufacturing apparatus having the aforementioned structure will be described with reference to FIGS. 5A through 5D.

Figure 5A:
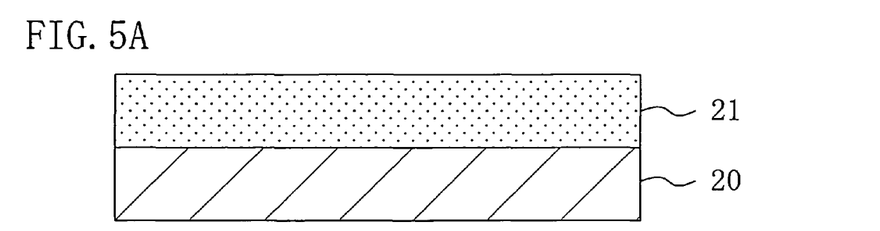
FIGS. 5A, 5B, 5C and 5D are cross-sectional views for showing procedures in a pattern formation method according to Embodiment 3 of the invention.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium nonaflate | 0.06 g |
| Quencher: triethanolamine | 0.002 g |
| Solvent: propylene glycol monomethyl ether acetate | 20 g |

Next, as shown in FIG. 5A, the aforementioned chemically amplified resist material is applied on a wafer 20 so as to form a resist film 21 with a thickness of 0.35 μm.

Figure 5B:
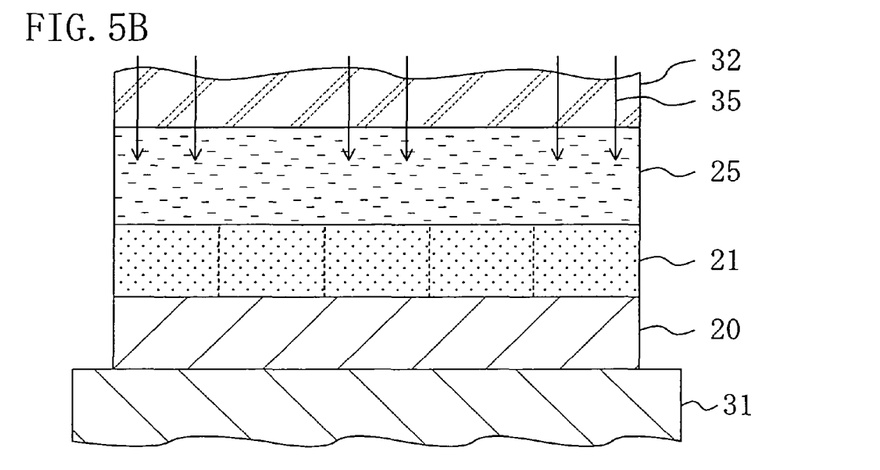

Then, the wafer 20 having the resist film 21 thereon is held on the movable stage 31 of the exposure unit 30 of the semiconductor manufacturing apparatus 10B shown in FIG. 4, and subsequently, as shown in FIG. 5B, a liquid 25 whose temperature is room temperature of approximately 23° C. is provided from the liquid supplying section 33 of FIG. 4 to a region between the resist film 21 and the projection lens 32. At this point, the temperature control unit 60 of FIG. 4 controls the cooling section 36 on the basis of the temperature data of the liquid 25 provided on the resist film 21 obtained at the second measurement point 54, so that the temperature of the movable stage 31 can be 13° C. Under this condition, pattern exposure is carried out by irradiating the resist film 21 through a mask (not shown) with exposing light 35 of ArF excimer laser with NA of 0.68.

Figure 5C:
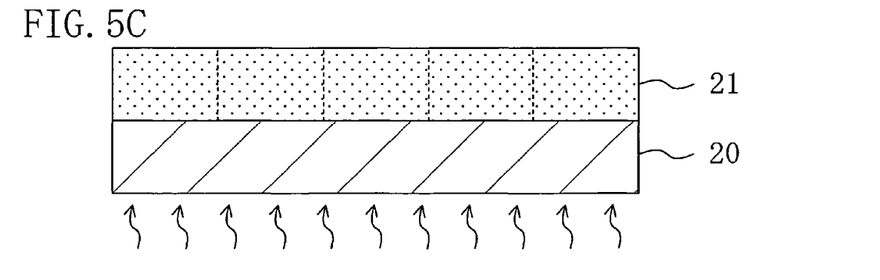
Figure 5D:
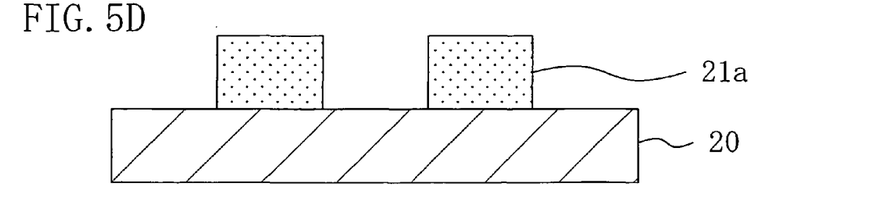

After the pattern exposure, as shown in FIG. 5C, the resist film 21 is baked with a hot plate at a temperature of 105° C. for 60 seconds, and thereafter, the resultant resist film 21 is developed with a 2.38 wt % tetramethylammonium hydroxide developer. In this manner, a resist pattern 21a made of an unexposed portion of the resist film 21 and having a line width of 0.09 μm is formed in a good shape as shown in FIG. 5D.

In this manner, in the pattern formation method of Embodiment 3, the temperature of the movable stage 31 is set to be lower than the temperature of the immersion liquid 25 during the exposure. Therefore, the liquid 25 minimally evaporates, and hence, no air space is formed in the liquid 25 provided between the resist film 21 and the projection lens 32. Accordingly, the abnormality of the refractive index or the like otherwise caused in the liquid 25 by an air space can be avoided, so that the liquid 25 can keep a desired exposure characteristic. As a result, the resist pattern 21a can be formed in a good shape through the immersion lithography.

Although the immersion liquid is water in each of Embodiments 1 through 3, it may be perfluoropolyether instead of water.

Moreover, in each of Embodiments 1 through 3, the light source for the pattern exposure is not limited to ArF excimer laser but may be KrF excimer laser, $F_2$ laser, $Xe_2$ laser, $Ar_2$ laser or ArKr laser.

Furthermore, in each of Embodiments 1 through 3, a resist film to be subjected to the pattern exposure is not limited to a positive resist but may be a negative resist, and needless to say, it is not limited to a chemically amplified resist.

As described so far, according to the semiconductor manufacturing apparatus and the pattern formation method using the same of this invention, since an immersion liquid provided on a resist film can be prevented from evaporating during exposure, pattern failures derived from the evaporation can be prevented, so that a resist pattern can be formed in a good shape. Accordingly, the present invention is useful as a pattern formation method or the like for use in fabrication process or the like for semiconductor devices.

What is claimed is:

1. A pattern formation method comprising the steps of:
    forming a resist film on a substrate;
    performing pattern exposure by selectively irradiating said resist film with exposing light with a liquid provided on said resist film; and
    forming a resist pattern by developing said resist film after the pattern exposure,
    wherein a temperature of an exposure atmosphere in a vicinity of said liquid is lower than a temperature of said liquid in the step of performing pattern exposure.

2. The pattern formation method of claim 1,
    wherein said temperature of the exposure atmosphere is higher than 0° C. and lower than 23° C.

3. The pattern formation method of claim 1,
    wherein said liquid is water or perfluoropolyether.

4. The pattern formation method of claim 1,
    wherein said liquid includes an additive.

5. The pattern formation method of claim 1,
    wherein said exposing light is KrF excimer laser, $Xe_2$ laser, ArF excimer laser, $F_2$ laser, KrAr laser or $Ar_2$ laser.

6. A pattern formation method comprising the steps of:
    forming a resist film on a substrate;

performing pattern exposure by selectively irradiating said resist film with exposing light with a liquid provided on said resist film and with said substrate cooled; and forming a resist pattern by developing said resist film after the pattern exposure, wherein a temperature of said cooled substrate is lower than a temperature of an exposure atmosphere.

7. The pattern formation method of claim 6,
wherein said temperature of the exposure atmosphere is higher than 0° C. and lower than 23° C.

8. The pattern formation method of claim 6,
wherein said liquid is water or perfluoropolyether.

9. The pattern formation method of claim 6,
wherein said liquid includes cesium sulfate or ethyl alcohol.

10. The pattern formation method of claim 6,
wherein said exposing light is KrF excimer laser, $Xe_2$ laser, ArF excimer laser, $F_2$ laser, KrAr laser or $Ar_2$ laser.

11. A pattern formation method comprising the steps of:

forming a resist film on a substrate;

performing pattern exposure by selectively irradiating said resist film with exposing light with a liquid provided on said resist film and said substrate cooled; and forming a resist pattern by developing said resist film after the pattern exposure, wherein a temperature of said cooled substrate is lower than a temperature of said liquid.

* * * * *